United States Patent [19]
Maeda et al.

[11] Patent Number: 5,307,518
[45] Date of Patent: Apr. 26, 1994

[54] DOUBLE-BALANCED MIXER

[75] Inventors: Youji Maeda, Matto; Wataru Takegawa, Komatsu; Yoshikuni Higashikawa, Matto; Akimasa Matsushima, Kaga, all of Japan

[73] Assignee: Murata Manufacturing Co., Ltd., Kyoto, Japan

[21] Appl. No.: 892,729

[22] Filed: May 29, 1992

Related U.S. Application Data

[63] Continuation of Ser. No. 463,999, Jan. 12, 1990, abandoned.

[30] Foreign Application Priority Data

Jan. 13, 1989 [JP] Japan .................. 1-007389

[51] Int. Cl.[5] .............. H04B 1/26; H03D 7/14
[52] U.S. Cl. .................. 455/326; 455/330; 455/333
[58] Field of Search ............ 455/326, 330, 333; 357/14, 76, 33, 40; 257/925, 544, 594, 910

[56] References Cited

U.S. PATENT DOCUMENTS

| | | | |
|---|---|---|---|
| 3,159,780 | 12/1964 | Parks | 257/906 |
| 3,586,929 | 6/1971 | Burmeister et al. | 357/33 |
| 3,999,205 | 12/1976 | Stewart | 357/40 |
| 4,278,985 | 7/1981 | Stobbs | 357/40 |

FOREIGN PATENT DOCUMENTS

| | | | |
|---|---|---|---|
| 2734571 | 2/1979 | Fed. Rep. of Germany | 357/76 |
| 0116506 | 5/1988 | Japan | 455/326 |
| 190410 | 8/1988 | Japan | 455/326 |

Primary Examiner—Reinhard J. Eisenzopf
Assistant Examiner—Chi Pham
Attorney, Agent, or Firm—Wenderoth, Lind & Ponack

[57] ABSTRACT

A double-balanced mixer which includes four diodes effectively connected to each other in a bridge connection on a substrate. The four diodes are formed into two sets of diodes, each one set including two of the four diodes connected to the same input line, with two twin-diodes each including two of the four diodes formed on the same semi-conductor chips being used for the two sets of the diodes.

14 Claims, 3 Drawing Sheets

DOUBLE-BALANCED MIXER

This application is a continuation of now abandoned U.S. patent application Ser. No. 07/463,999, filed Jan. 12, 1990.

BACKGROUND OF THE INVENTION

The present invention generally relates to an electrical mixer and more particularly, to a double-balanced mixer for use, for example, in a CATV (cable television) tuner or the like.

In FIG. 4, there is shown one example of a conventional double-balanced mixer of the above type which includes four diodes 11, 12, 13 and 14 connected effectively in a bridge connection between a transmission line transformer 22 as a phase distributor and phase distributors 31 and 32 composed of coils and capacitors, with input and output transmission line transformers 21 and 23 being provided if needed.

High frequency signals RF supplied to a terminal 41 are subjected to frequency conversion by the transmission line transformer 22, the diodes 11 to 14 and the phase distributors 31 and 32, based on a local oscillator signal LO fed to a terminal 42, and thus, intermediate signals IF are outputted from another terminal 43.

The characteristics of the diodes 11, 12, 13 and 14 may be represented by X1, X2, X3 and X4 (such characteristics mainly being related to the capacitance across its terminals and the forward direction voltage-current characteristics) and should be in a relationship as in $$X1 = X2 = X3 = X4$$

in order to maintain a balancing of the circuit, and therefore, it has been a conventional practice to select diodes having uniform characteristics from among many diodes so as to use four diodes as one set, thus requiring a troublesome procedure for the selection of diodes.

Moreover, when the respective diodes 11 to 14 are to be actually attached onto a printed circuit board 50, in order to maintain, the balanced inductance thereof by making the length of lead wires of the respective diodes 11 to 14 equal, it is necessary to dispose one of the intersecting diodes (the diode 12 in the drawing) on a reverse surface of the printed circuit board 50 as shown in FIGS. 5(A) and 5(B), and thus, more labor is required for the attaching and soldering of the diodes to be mounted on both surfaces of the circuit board 50.

Furthermore, in the case where the diodes 11 to 14 are to be attached onto both surfaces of the printed circuit board as described above, soldering thereof must be effected two times separately for the front and reverse surfaces of the printed circuit board 50, and at this time, since the selected four diodes are required to be used for one set as described earlier, management of diodes has been necessary so that one set of diodes is not confused with another set of diodes during the two soldering operations, thus also requiring a troublesome procedure therefor.

SUMMARY OF THE INVENTION

Accordingly, an essential object of the present invention is to provide a double-balanced mixer in which selection and management of diodes to be used therefor are not required, while it is made possible to mount such diodes on one surface of a substrate or printed circuit board during manufacture.

Another object of the present invention is to provide a double-balanced mixer of the above described type which is simple in construction and functionally stable and highly reliable.

In accomplishing these and other objects, according to one preferred embodiment of the present invention, there is provided a double-balanced mixer which includes four diodes effectively connected to each other in a bridge connection on a substrate. The four diodes are formed into two sets of diodes, each set including two of said diodes connected to the same input line. Two twin-diode devices, each including two diodes formed on the same semi-conductor chips, are used for said two sets of diodes.

The two diodes in each of the twin-diodes as referred to above have characteristics equal to each other, since they are formed on the same semi-conductor chip.

Moreover, it has been found, according to the present invention, that when such twin-diodes are used in the manner as described above, the characteristics between the two twin-diodes are not necessarily required to be exactly equal to each other.

Accordingly, characteristic selection of the twin-diodes and management thereof after the selection may be completely dispensed with.

BRIEF DESCRIPTION OF THE DRAWINGS

These and other objects and features of the present invention will become apparent from the following description taken in conjunction with the preferred embodiment thereof with reference to the accompanying drawings, in which;

FIG. 4 is an electrical circuit diagram similar to FIG. 1, which particularly shows a circuit construction of a conventional double-balanced mixer (already referred to;

DETAILED DESCRIPTION OF THE INVENTION

Figure 1:
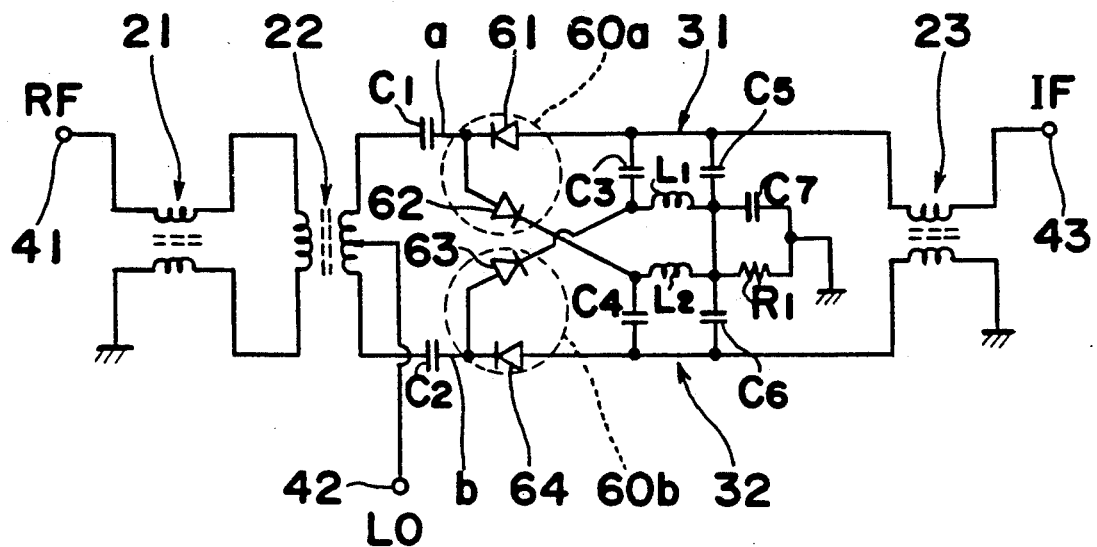
FIG. 1 is an electrical circuit diagram showing a general circuit construction of a double-balanced mixer according to one preferred embodiment of the present invention.

Before the description of the present invention proceeds, it is to be noted that like parts are designated by like reference numerals throughout the accompanying drawings.

Figure 4:
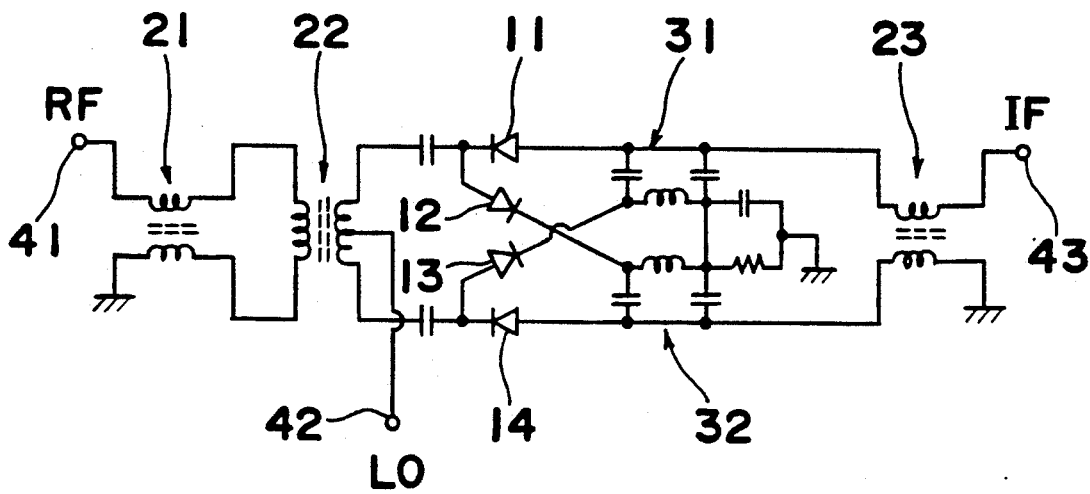
Figure 5A:
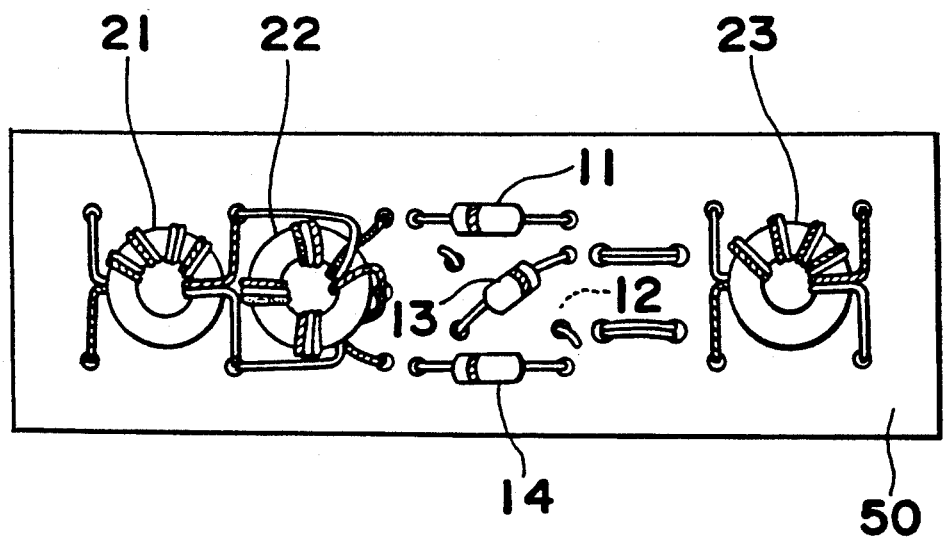
FIG. 5(A) is a top plan view of the front face of a printed circuit board on which the circuit of the conventional double-balanced mixer of FIG. 4 is formed.
Figure 5B:
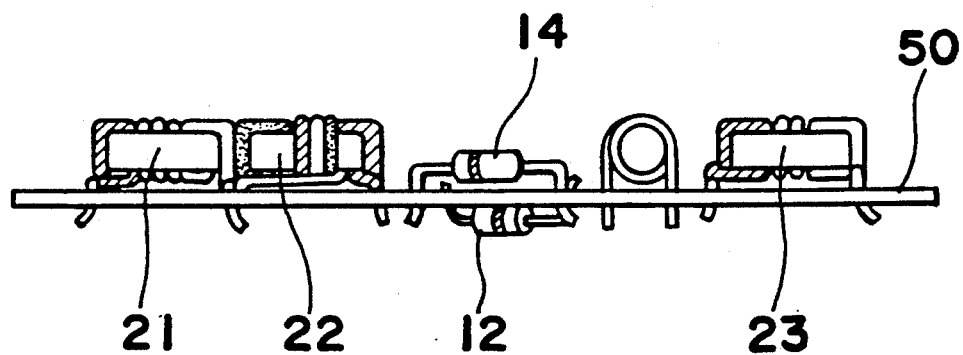
FIG. 5(B) is a side elevational view, partly in section, of the printed circuit board of FIG. 5(A).

Referring now to the drawings, there is shown in FIG. 1 a circuit diagram of a double-balanced mixer according to one preferred embodiment of the present invention, in which like parts in FIG. 4 of the conventional double-balanced mixer are designated by like reference numerals and symbols for brevity of explanation, with the description mainly directed to a difference thereof from the conventional arrangement of FIG. 4.

In the embodiment of FIG. 1, for the set of diodes connected to the same input line a, the diodes 11 and 12 employed in the conventional double-balanced mixer are replaced by a twin-diode 60a having two diodes 61 and 62 formed on the same semi-conductor chip, as shown in an equivalent circuit (FIG. 2), while for the set of diodes to be connected to-the same input line b, the diodes 13 and 14 in the conventional arrangement are also replaced by another twin-diode 60b having two diodes 63 and 64 similarly formed on the same semi-conductor chip as shown in the equivalent circuit.

The two diodes 61 and 62 or 63 and 64 in each of the twin-diodes 60a and 60b have characteristics equal to each other, since they are formed on the same semi-conductor chip.

Furthermore, according to the present invention, it has been found that when such twin-diodes 60a and 60b are applied as described above, the characteristics between the twin-diodes 60a and 60b are not necessarily required to be made equal to each other.

Figure 2:
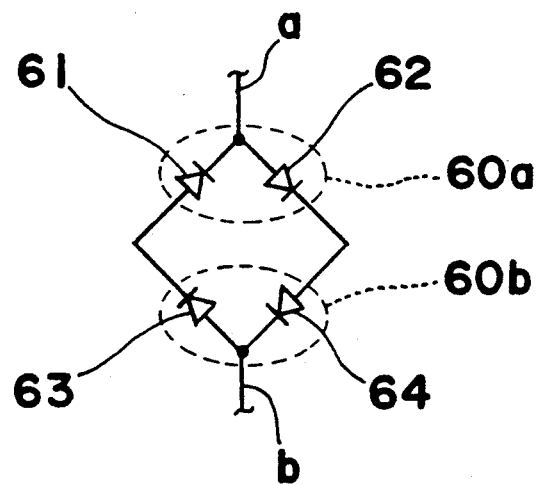
FIG. 2 is an effective circuit diagram showing connection of a diode bridge in FIG. 1.

More specifically, in a bridge circuit of FIG. 2, if the characteristics of the diodes 61 to 64 in the respective twin-diodes 60a and 60b (which are mainly the capacity across terminals and forward direction voltage-current characteristic) are represented by X1, X2, X3 and X4, the relationship therebetween may be $$X1.X4 = X2.X3 \qquad (1)$$

as conventionally accepted in order that the bridge circuit as illustrated maintains the balanced state.

However, due to the employment of the twin-diodes, the relations $X1=X2$ and $X3=X4$ are established at all times as described earlier.

Accordingly, since the equation (1) may be established even if the relationship is such that $X \neq X4$ and $X2 \neq X3$, the balanced state of the circuit may be maintained.

As a result, the troublesome characteristic selection of the twin-diodes and management thereof after the selection, etc., can be completely eliminated, and therefore, it becomes possible to mount the twin-diodes on the printed circuit board or the like without distinction. Accordingly, not only the labor for the selection of the diodes and management thereof after the selection is dispensed with, but automation of the mounting may be readily introduced.

Furthermore, since it is only required to mount two twin-diodes on the circuit board, such twin-diodes can be attached onto one surface of the circuit board. Therefore, automization of the mounting may be facilitated in this respect also, as well as the simplification of the diode mounting.

In other words, it becomes possible to attach the twin-diodes 60a and 60b onto the circuit board in exactly the same manner as other parts without the necessity for any particular handling thereof.

Figure 3:
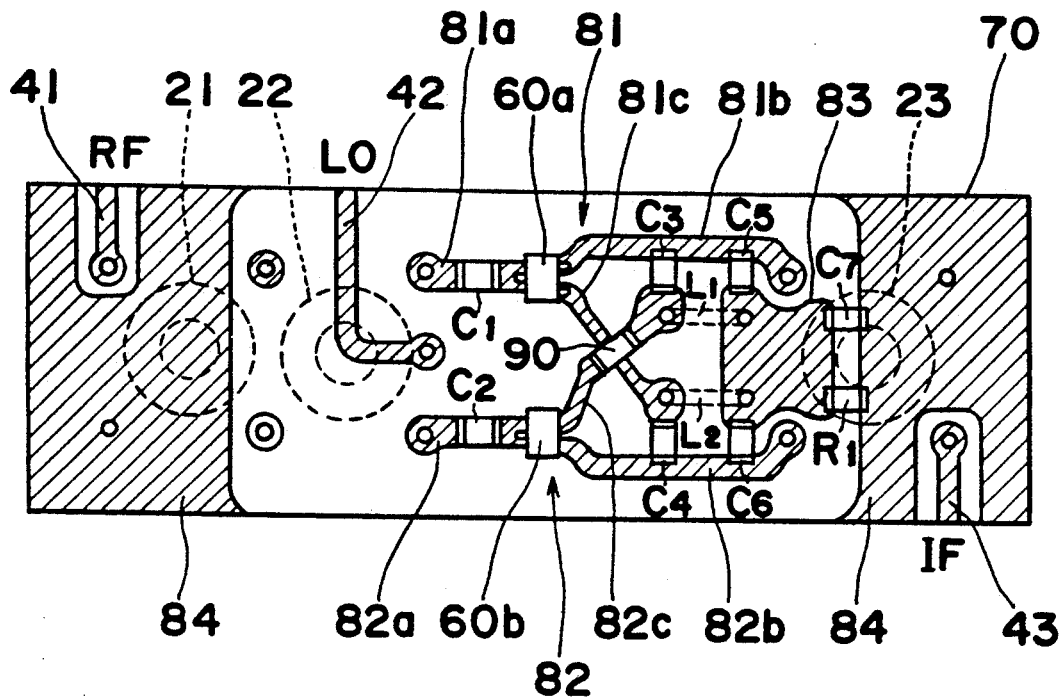
FIG. 3 is a top plan view at the reverse face of a printed circuit board on which the circuit of FIG. 1 is formed.

Reference is also made to FIG. 3 showing a reverse face of a printed circuit board 70 on which the circuit as illustrated in FIG. 1 is formed.

In the foregoing embodiment, the twin-diodes 60a and 60b, capacitors C1 to C7, and a resistor R1 each of a chip type are employed together with coils L1 and L2. In this case, a conductor pattern for the printed circuit board 70, particularly, the conductor pattern extending from a secondary side of the transmission line transformer 22 to a primary side of the transmission line transformer 23 should preferably be in the from as shown in FIG. 3, by which the respective chip parts may be readily mounted on the surface of the circuit board, with the balanced state of the circuit being favorably maintained.

More specifically, at the portion extending from the secondary side of the transformer 22 to the primary side of the transformer 23, two conductor patterns 81 and 82 are provided which are generally symmetrical with each other and which each have a Y-shape to be bifurcated through a gap, with the twin-diodes 60a and 60b being attached to the bifurcating portions of the respective conductor patterns 81 and 82 as shown. Stem portions 81a and 82a of the conductor patterns 81 and 82 before the bifurcation are directed generally parallel to each other. At the ends of the stem portions 81a and 82a, the secondary windings of the transmission line transformer 22 are respectively connected, while at intermediate portions of the stem portions 81a and 82a, gaps are formed to which the capacitors C1 and C2 are attached.

First arm portions 81b and 82b of the conductor patterns 81 and 82 after bifurcation are generally parallel to each other, and to the ends of said first arm portions 81b and 82b, primary windings of the transmission line transformer 23 are respectively connected.

Meanwhile, second arm portions 81c and 82c of the conductor patterns 81 and 82 after the bifurcation cross each other, and in the course of the one second arm portion 82c, there is formed a gap, to which a jumper part 90 (which may be regarded, for example, as a chip resistor of 0 Ω) having the same shape as a chip resistor is attached. Moreover, at ends of the second arm portions 81c and 82c, the coils L1 and L2 are respectively connected, while the capacitors C3 and C4 are respectively connected between said ends of the second arm portions 81c and 82c, and the first arm portions 81b and 82b.

Furthermore, between the ends of the first arm portions 81b and 82b of the conductor patterns 81 and 82, another conductor pattern 83 having a large area is formed, to which other ends of the coils L1 and L2 are connected. The capacitors C5 and C6 are respectively connected between the large area conductor pattern 83 and the first arm portions 81b and 82b, and further, the capacitor C7 and the resistor R1 are connected between said conductor pattern 83 and one of other conductor patterns 84 for grounding formed adjacent to the conductor pattern 83 at the right end portion of the circuit board 70 in FIG. 3. Although the conductor pattern 83 should preferably be in such a large area, it is not essentially limited in its size.

As is clear from the foregoing description, according to the present invention, by employing the two twin-diodes for the four diodes to constitute the bridge circuit, it becomes completely unnecessary to select the characteristics of the twin-diodes and to manage such twin-diodes after the selection, thus making it possible to mount the twin-diodes on the circuit board without distinction. Accordingly, troublesome procedures required for the selection of diodes and management thereof after the selection, etc., may be eliminated, with simultaneous facilitation of automization for attaching diodes.

Furthermore, since it is merely required to mount the two twin-diodes onto the circuit board, such diodes may be attached onto one side face of the circuit board, thus the mounting of diodes is simplified, and the automization for the attachment of diodes may be facilitated in this respect also.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A double-balanced mixer comprising:

a printed circuit board having opposite first and second surfaces;

circuit means for frequency converting a first signal into a second signal;

said circuit means including first and second twin-diodes each having first, second and third terminal leads and each fixed to said first surface of said printed circuit board, said first twin-diode including first and second diodes formed on a single first semiconductor chip, said second twin-diode including third and fourth diodes formed on a single second semiconductor chip;

first and second conductor patterns disposed on said first surface of said printed circuit board, said first and second conductor patterns being generally symmetrical to each other and each generally defining a Y-shaped pattern having first, second and third legs;

wherein said second legs of said first and second conductor patterns cross each other at a crossing point and are electrically isolated from each other at said crossing point;

wherein said first terminal lead extends from a first side of opposite first and second sides of said first and second twin-diodes and is in contact with said first leg of said first and second conductor patterns, respectively;

wherein said second terminal lead extends from said second side of said opposite first and second sides of said first and second twin-diodes and is in contact with said second leg of said first and second conductor patterns, respectively;

wherein said third terminal lead extends from said second side of said opposite first and second sides of said first and second twin-diodes and is in contact with said third leg of said first and second conductor patterns, respectively;

wherein each of said first and second diodes has first and second poles of respective opposite polarities, and wherein said first pole of said first diode and said second pole of said second diode are connected to said first terminal lead, and wherein said second pole of said first diode is connected to said third terminal lead, and wherein said first pole of said second diode is connected to said second terminal lead;

wherein each of said third and fourth diodes has third and fourth poles of respective opposite polarities, and wherein said third pole of said third diode and said fourth pole of said fourth diode are connected to said first terminal lead, and wherein said fourth pole of said third diode is connected to said second terminal lead, and wherein said third pole of said fourth diode is connected to said third terminal lead; and, wherein an arranged order of said second and third terminal leads along said second side of said first twin-diode is opposite an arranged order of said second and third terminal leads along said second side of said second twin-diode.

2. A double-balanced mixer as recited in claim 1, wherein said first leg of said first conductor pattern is parallel to said first leg of said second conductor pattern.

3. A double-balanced mixer as recited in claim 1, wherein said third leg of said first conductor pattern is parallel to said third leg of said second conductor pattern.

4. A double-balanced mixer as recited in claim 2, wherein said third leg of said first conductor pattern is parallel to said third leg of said second conductor pattern.

5. A double-balanced mixer as recited in claim 1, wherein said circuit means further includes first, second, third and fourth capacitors fixed to said first surface of said printed circuit board;

wherein said first leg of each of said first and second conductor patterns is made up first and second aligned portions which are spaced from one another;

wherein said first and second capacitors are electrically connected between said first and second aligned portions of said first leg of said first and second conductor patterns, respectively;

wherein said third capacitor is electrically connected between said third leg of said first conductor pattern and an end portion of said second leg of said second conductor pattern; and wherein said fourth capacitor is electrically connected between said third leg of said second conductor pattern and an end portion of said second leg of said first conductor pattern.

6. A double-balanced mixer as recited in claim 4, wherein said circuit means further includes first, second, third and fourth capacitor fixed to said first surface of said printed circuit board;

wherein said first leg of each of said first and second conductor patterns is made up first and second aligned portions which are spaced from one another;

wherein said first and second capacitors are electrically connected between said first and second aligned portions of said first leg of said first and second conductor patterns, respectively;

wherein said third capacitor is electrically connected between said third leg of said first conductor pattern and an end portion of said second leg of said second conductor pattern; and wherein said fourth capacitor is electrically connected between said third leg of said second conductor pattern and an end portion of said second leg of said first conductor pattern.

7. A double-balanced mixer as recited in claim 5, further comprising a transformer fixed to said second surface of said printed circuit board and having secondary-side terminals electrically connected to said first aligned portion of said first leg of said first and second conductor portions, respectively.

8. A double-balanced mixer as recited in claim 6, further comprising a transformer fixed to said first second surface of said printed circuit board and having secondary-side terminals electrically connected to said first aligned portion of said first leg of said first and second conductor portions, respectively.

9. A double-balanced mixer as recited in claim 7, further comprising a third conductor pattern generally symmetrically disposed between an end portion of said third legs of said first and second conductor patterns;
wherein said circuit means further includes first and second coils fixed to said second surface of said printed circuit board and fifth and sixth capacitors fixed to said first surface of said printed circuit board;
wherein said first and second coils are electrically connected between said third conductor pattern and the end portion of said second leg of said first and second conductor patterns, respectively;
wherein said fifth and sixth capacitors are electrically connected between said third conductor pattern and said third leg of said first and second conductor patterns, respectively.

10. A double-balanced mixer as recited in claim 8, further comprising a third conductor pattern generally symmetrically disposed between an end portion of said third legs of said first and second conductor patterns;
wherein said circuit means further includes first and second coils fixed to said second surface of said printed circuit board and fifth and sixth capacitors fixed to said first surface of said printed circuit board;
wherein said first and second coils are electrically connected between said third conductor pattern and the end portion of said second leg of said first and second conductor patterns, respectively;
wherein said fifth and sixth capacitors are electrically connected between said third conductor pattern and said third leg of said first and second conductor patterns, respectively.

11. A double-balanced mixer as recited in claim 9, further comprising a fourth conductor pattern disposed on said first surface of said printed circuit board which forms a means for connecting to a ground;
wherein said circuit means further comprises a resistor and a seventh capacitor each disposed on said first surface of said printed circuit board and each electrically connected between said third and fourth conductor patterns.

12. A double-balanced mixer as recited in claim 10, further comprising a fourth conductor pattern disposed on one of said first and second surfaces of said printed circuit board which forms a means for connecting to a ground;
wherein said circuit means further comprises a resistor and a seventh capacitor each disposed on one of said first and second surfaces of said printed circuit board and each electrically connected between said third and fourth conductor patterns.

13. A double-balanced mixer as recited in claim 11, wherein said circuit means further includes a second transformer disposed on said second surface of said printed circuit board and having primary side terminals electrically connected to said end portion of said third leg of said first and second conductor patterns, respectively, and having a secondary side terminal electrically connected to said fourth conductor pattern.

14. A double-balanced mixer as recited in claim 12, wherein said circuit means further includes a second transformer disposed on said second surface of said printed circuit board and having primary side terminals electrically connected to said end portion of said third leg of said first and second conductor patterns, respectively, and having a secondary side terminal electrically connected to said fourth conductor pattern.

* * * * *